United States Patent [19]
Liu et al.

[11] Patent Number: 6,087,860
[45] Date of Patent: Jul. 11, 2000

[54] APPARATUS AND METHOD FOR GENERATING AN ENVELOPE FOR DATA SIGNALS USING CMOS

[75] Inventors: Zhenhua Liu, Sunnyvale; Yi Cheng, San Jose, both of Calif.

[73] Assignee: Advanced Micro Devices, Inc., Sunnyvale, Calif.

[21] Appl. No.: 09/172,089

[22] Filed: Oct. 14, 1998

[51] Int. Cl.[7] .................................................. H03K 5/153
[52] U.S. Cl. ................................. 327/65; 327/63; 327/52
[58] Field of Search ............................... 327/65, 306, 52, 327/62, 63

[56] References Cited

U.S. PATENT DOCUMENTS

| | | | |
|---|---|---|---|
| 4,392,406 | 7/1983 | Fritz | 84/1.26 |
| 4,737,866 | 4/1988 | Ebata | 360/51 |
| 4,879,558 | 11/1989 | Swanson | 341/51 |
| 5,629,641 | 5/1997 | Cheng | 327/108 |
| 5,633,893 | 5/1997 | Lampe et al. | 375/297 |
| 5,696,790 | 12/1997 | Graham et al. | 375/238 |
| 5,739,780 | 4/1998 | Cheng et al. | 341/135 |

*Primary Examiner*—Timothy P. Callahan
*Assistant Examiner*—Hai L. Nguyen

[57] ABSTRACT

A CMOS device for generating a waveformn envelope is provided in a network that uses a twisted pair medium, such as a telephone line, to connect stations. The CMOS device receives analog signals representing pulsed data signals sent over the telephone line and generates an envelope waveform for the received analog signal. The envelope waveform can then be used to detect the arrival of data, as opposed to noise on the network.

16 Claims, 7 Drawing Sheets

APPARATUS AND METHOD FOR GENERATING AN ENVELOPE FOR DATA SIGNALS USING CMOS

BACKGROUND OF THE INVENTION

1. Technical Field

The present invention relates to data communications and more particularly, to devices and methods for generating an envelope waveform for data signals received over telephone lines.

2. Background Art

Local area networks use a network cable or other network media to link nodes (e.g., workstations, PCs and switches) to the network. Each local area network architecture uses a media access control (MAC) layer that enables a network interface device at each node to share access to the media. Conventional local area network architectures use media access controllers operating according to half-duplex or full-duplex Ethernet (ANSI/IEEE standard 802.3) protocol using prescribed network medium.

With the increased use of computers in the home, a need has developed for networking these computers. However, connecting multiple PCs and peripherals in the home typically requires installing special cabling and setting up Ethernet repeaters to link the devices.

Recently, efforts have been made to link computers in the home using Plain Old Telephone Service (POTS) line wiring instead of established local area network media. Such an arrangement, referred to herein as a home network environment, provides the advantage that existing telephone wiring in a home may be used to implement a home network. However, telephone lines are inherently noisy due to spurious noise caused by electrical devices in the home, for example, dimmer switches, transformers of home appliances, etc. In addition, the twisted pair telephone lines suffer from turn-on transients due to on-hook and off-hook and noise pulses from the standard POTS telephones. Further, the wiring topology of homes is variable, which makes data transmission signaling more complex.

One way for a network station to avoid problems with noise in the telephone network is to detect the arrival time of pulses used to convey digital information. For example, a band limited waveform, e.g., between 5.5 MHz and 9.5 MHz, can be used to effectively reject POTS signaling and all out of band noise and harmonic power. The envelope of the band limited waveform can then be generated and supplied to a slicing circuit having a threshold level selected to identify the arrival position of a received pulse. When the envelope crosses the threshold level, the slicing circuit detects the arrival position of the pulse. The detected signal may then be effectively sliced with an adaptive slice level designed to track the ambient noise level.

Previous attempts to generate the envelope of an incoming signal typically require amplifiers requiring high power, e.g., +5 volts and −5 volts, Schottky diodes and other discrete elements, such as relatively large capacitors. These elements are not practical in a low power CMOS device that exhibits high speed operation due to high power requirements, space constraints and general unreliability of such elements implemented in CMOS.

SUMMARY OF THE INVENTION

There is a need for a CMOS device to generate an envelope waveform for data transmission signals.

There is also a need for a method of generating an envelope waveform for data transmission signals in CMOS.

These and other needs are met by the present invention, where an envelope generator is used to generate an envelope waveform for data signals transmitted over a twisted pair medium.

According to one aspect of the invention, a CMOS device is configured to receive data transmitted over a twisted pair medium. The CMOS device includes a receive device to receive an incoming analog signal transmitted over the twisted pair medium. The CMOS device also includes an envelope generator configured to generate an envelope waveform based on the received analog signal.

Another aspect of the present invention provides a method, in a network station including a CMOS device, for receiving and transmitting data over a twisted pair medium. The method includes receiving an incoming analog signal transmitted over the twisted pair medium. The method also includes generating an envelope waveform based on the received analog signal.

Additional advantages and features of the present invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

Reference is made to the attached drawings, wherein elements having the same reference numeral designations represent like elements throughout.

BEST MODE FOR CARRYING OUT THE INVENTION

Figure 1:
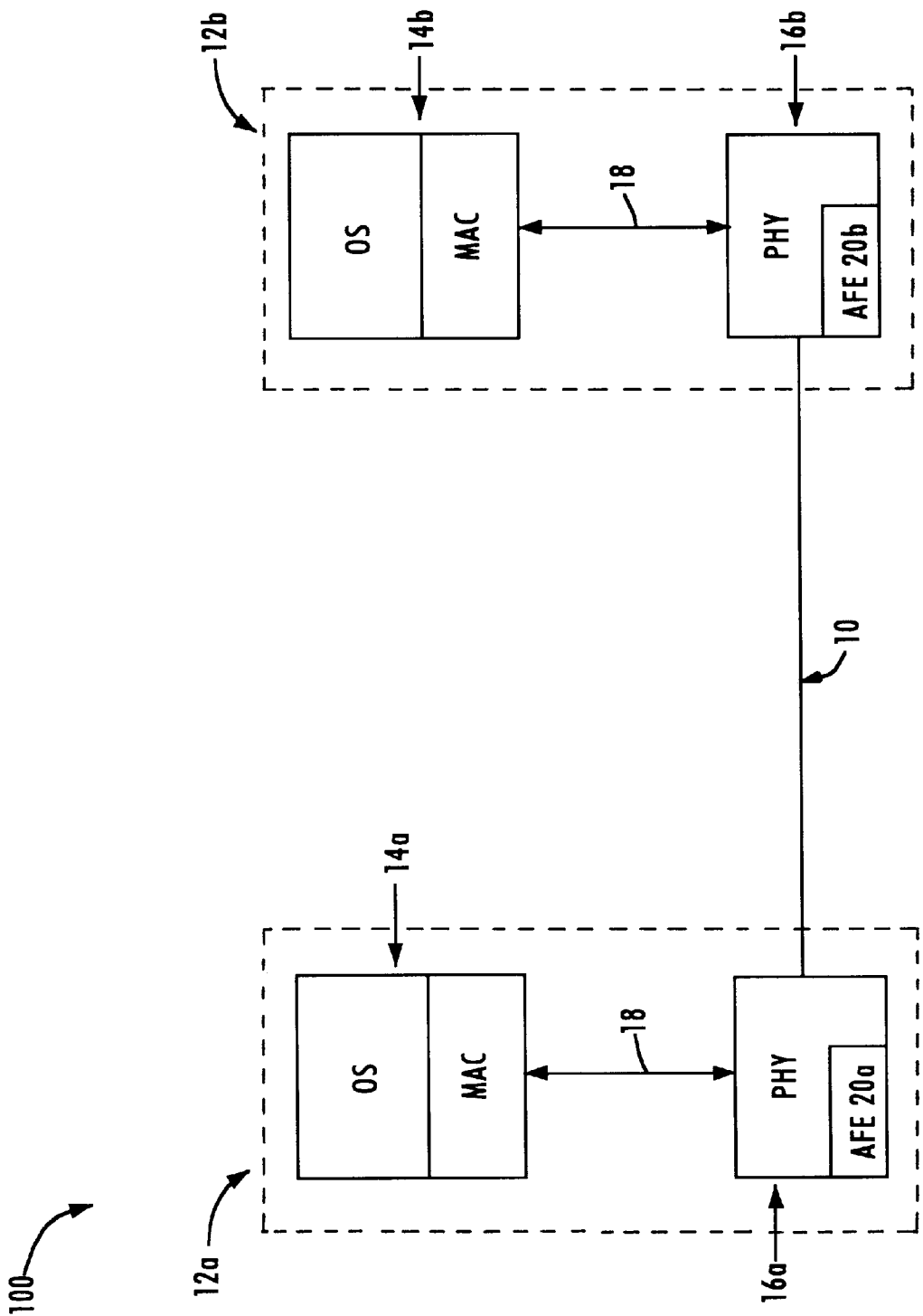
FIG. 1 is a block diagram illustrating a network for transmitting data over a telephone line medium according to an embodiment of the present invention.

FIG. 1 is a block diagram of a network 100 for transmission of data in a home networking environment according to an embodiment of the present invention.

The network 100 includes a telephone line medium 10, specifically a twisted pair medium and network stations 12a and 12b configured for sending and receiving data packets on the telephone line medium 10. Only two network stations have been shown in order not to unduly obscure the present invention. However, network 100 can be configured to include more than two stations, based on the particular network requirements.

The telephone line medium 10 includes a plurality of branch connections (not shown) to interconnect telephones, facsimile machines, etc., to a telephone network interface, for connection to a public switched telephone network. The term "home networking environment", however, refers to use of the twisted pair medium 10 within a subscriber premises. Hence, the network 100 operates independently from telephony-related services provided by the public switched telephone network.

As shown in FIG. 1, each network station 12, for example a personal computer or intelligent consumer electronics device, includes an operating system (OS) and media access control (MAC) portion 14 for sending and receiving data packets onto the network medium 10.

Each network station 12 also includes a physical (PHY) layer device 16 for transmitting data packets from the corresponding media access controller (MAC) onto the telephone line medium 10, and for supplying data frames (i.e., data packets) from the telephone line medium 10 to the MAC as receive data. Transmit and receive data is transferred between the MAC portion and the PHY 16 via data path 18. PHY 16 includes an analog front end (AFE) device 20 to transmit/receive analog signals via telephone line 10.

Use of telephone lines as the transmission medium results in a substantial amount of noise on the network medium 10. Hence, it is necessary to be able to reliably detect the presence of data signals, as opposed to noise on the network 100. Advantageously, the present invention employs an envelope generator to generate an envelope waveform for incoming signals. The envelope waveform can then be used to indicate the arrival of data, as opposed to noise.

Figure 2:
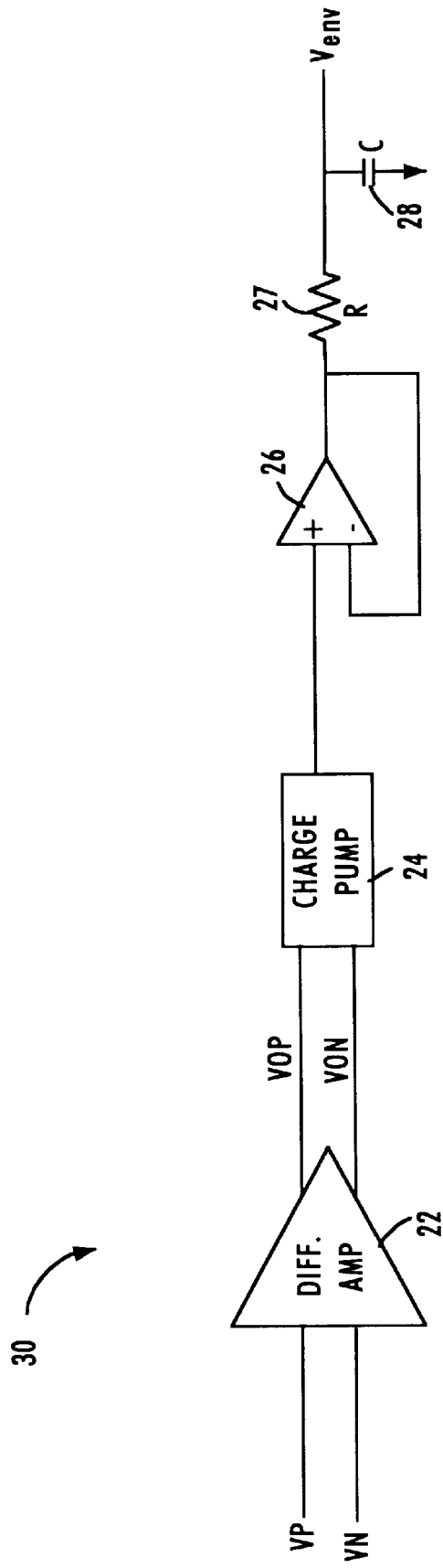
FIG. 2 is a block diagram illustrating an envelope generator in accordance with an embodiment of the present invention.

FIG. 2 is a diagram illustrating an envelope generator according to an embodiment of the present invention. In the exemplary embodiment, envelope generator 30 is included in Analog Front End (AFE) 20 of PHY 16.

Referring to FIG. 2, a differential amplifier 22 receives a differential input signal, labeled as VP and VN, transmitted over network medium 10. In an exemplary embodiment, differential amplifier 22 amplifies the input signal 0–40 dB, based on an incoming signal waveform having an amplitude ranging from about 10–600 millivolts. Alternatively, the differential amplifier 22 can be designed to amplify the incoming signal to other levels based on the particular network characteristics, e.g., signal transmission levels.

Figure 3:
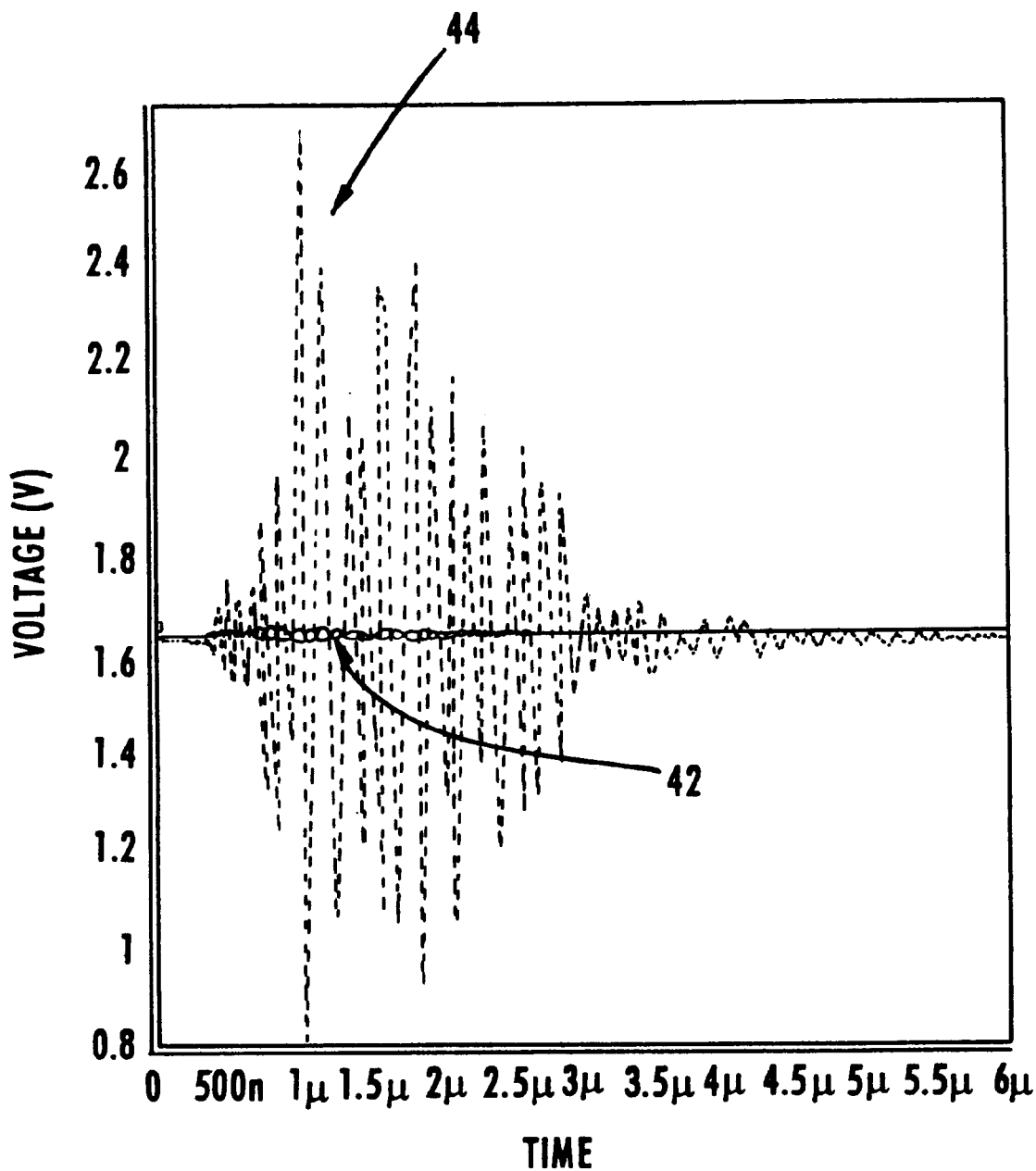
FIG. 3 is a waveform diagram illustrating a transmission signal and an amplified version of the transmission signal according to an embodiment of the present invention.

FIG. 3 illustrates an example of an input data signal received at a network station 12. Referring to FIG. 3, incoming data signal 42 consists of a series of pulses, which were converted into an analog waveform for transmission by AFE 20 of the transmitting network station 12. The series of pulse shown in FIG. 3 has a duration of approximately 6 $\mu$s. However, the present invention is useable with any group of pulsed data signals and the specific duration of the series of pulses is based on the particular network protocol. Differential amplifier 22 amplifies input signal 42, thereby generating differential output signal (VOP–VON), labeled as 44.

Figure 4:
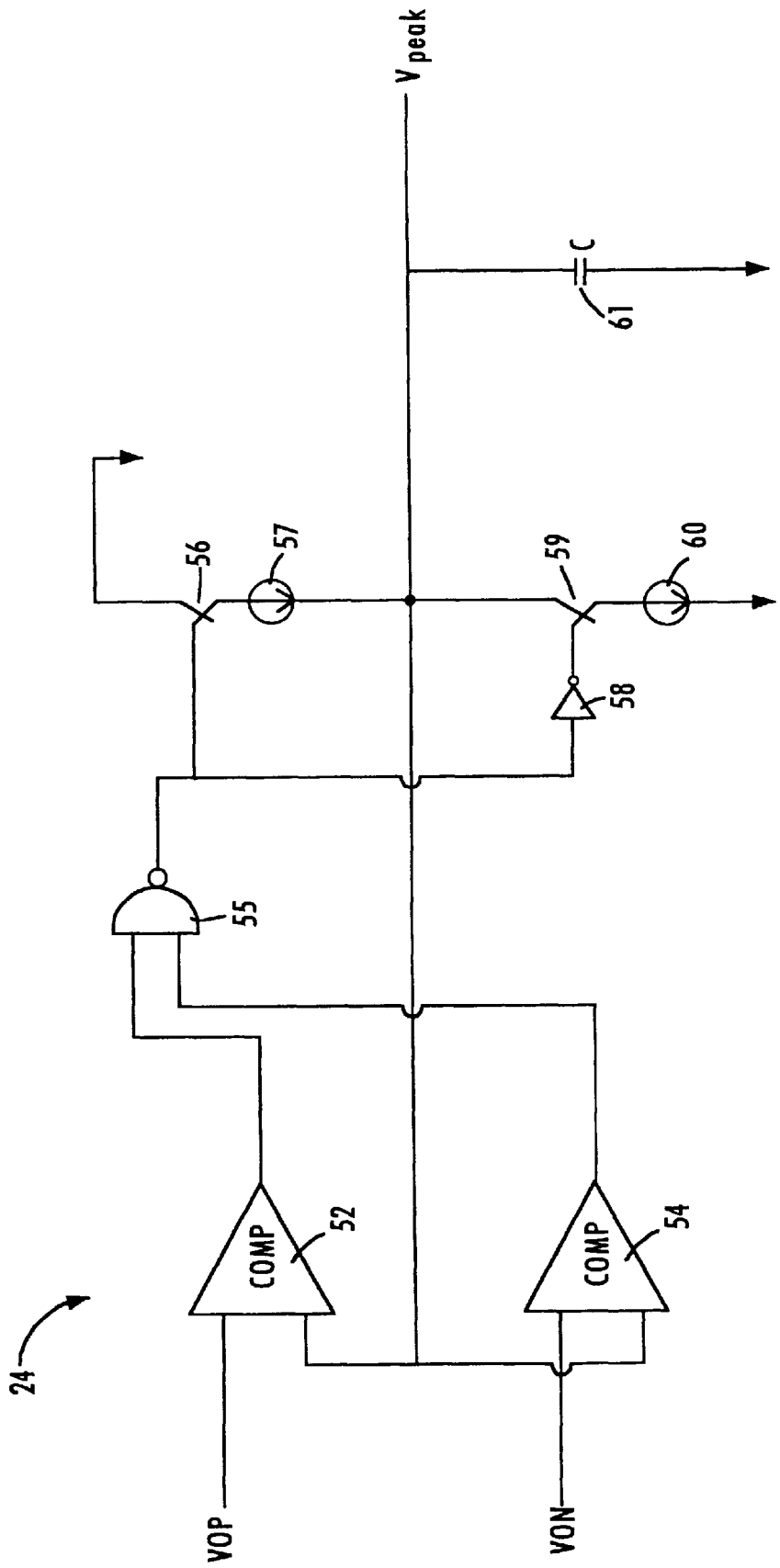
FIG. 4 is a block diagram illustrating a charge pump circuit in accordance with an embodiment of the present invention.

Referring back to FIG. 2, charge pump control circuit 24 receives differential output signal (VOP–VON) and operates to generate an envelope waveform for the received signal. FIG. 4 illustrates a detailed block diagram of the charge pump circuit 24 according to an embodiment of the present invention.

Referring to FIG. 4, charge pump circuit 24 includes comparators 52 and 54. Comparators 52 and 54 are configured to compare the positive and negative outputs from differential amplifier 22 and convert the differential outputs to a pulsating dc signal. From FIG. 4, when both the positive and negative signals, VOP and VON, are lower than the output (Vpeak) of the charge pump circuit 24, comparators 52 and 54 will both output logical "0". When both outputs are "0", NAND gate 55 outputs logical "1", thereby closing switch 56. Current from voltage controlled current source 57 then charges capacitor 61.

The opposite operation occurs when both the positive and negative inputs, VOP and VON, are higher than the output Vpeak of charge pump circuit 24. That is, when VOP and VON are both higher than Vpeak, the output of comparators 52 and 54 will be "1" and the output of NAND gate 55 will be "0". Inverter 58 then outputs "1", thereby closing switch 59 and effectively discharging capacitor 61. In this manner, charge pump circuit 24 outputs Vpeak that follows the envelope of the input waveform.

Figure 5:
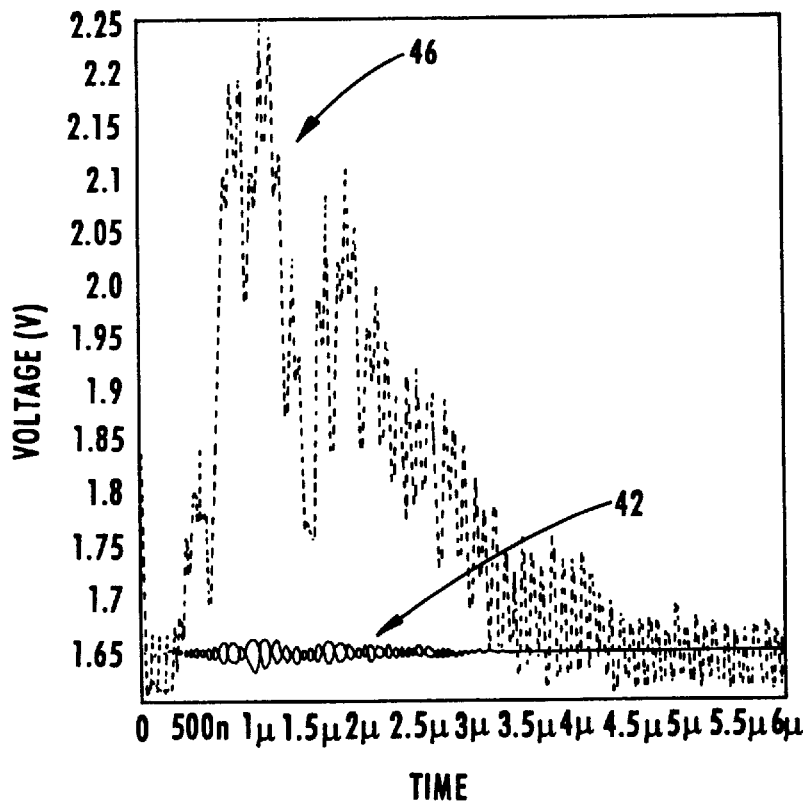
FIG. 5 is a waveform diagram illustrating an envelope waveform for the signal of FIG. 3.

FIG. 5 illustrates the output of charge pump circuit 24, Vpeak, for the waveform 44 of FIG. 3. Input signal waveform 42 is also shown in FIG. 5. The envelope waveform 46, Vpeak, can then be used to detect the arrival of pulse data at a network station, as discussed in more detail below. However, in an embodiment of the present invention, the envelope generator advantageously includes a filtering device to filter out noise and harmonics from Vpeak.

Referring to FIG. 2, an operation amplifier (Op Amp) 26 is coupled to the output of charge pump circuit 24. Op Amp 26 is configured as a unity gain amplifier and the output is coupled to resistor 27 and capacitor 28, connected in a low-pass RC filter configuration. The specific resistor and capacitor values are based on the particular design requirements, e.g., the input signal and noise characteristics, to filter out undesirable noise and harmonic components from Vpeak.

Figure 6:
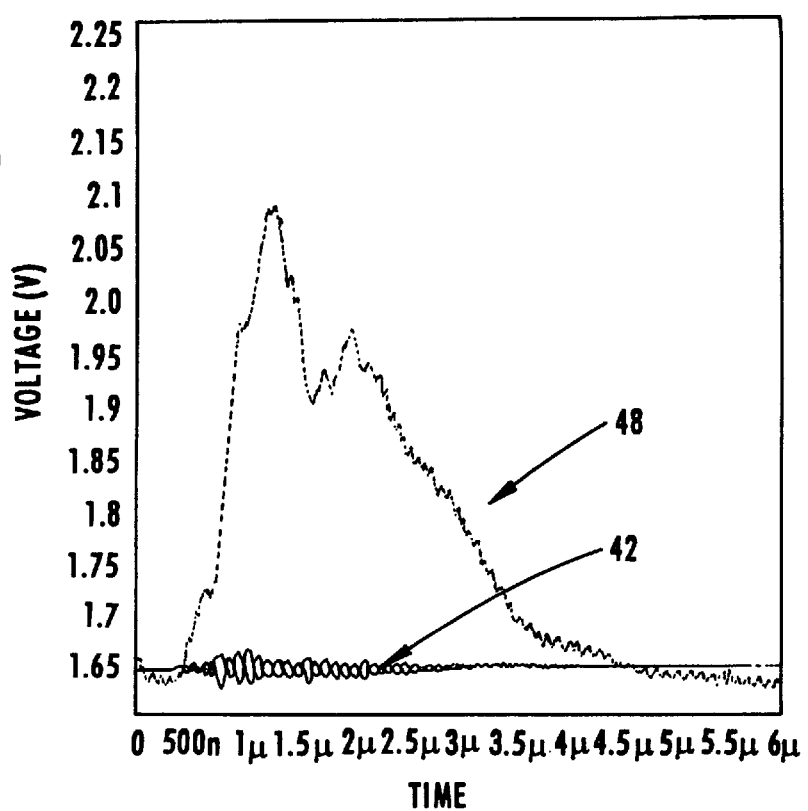
FIG. 6 illustrates a filtered envelope waveform for the signal of FIG. 5.

FIG. 6 illustrates the envelope waveform 48, Venv, output from envelope generator 30. As shown in FIG. 6, Op Amp 26 and RC filtering circuit, 27 and 28, generate a smoothed envelope waveform that can then be used to detect incoming data signals, as opposed to noise. Methods of using an envelope waveform to detect incoming data signals are well-known.

According to the exemplary embodiment of the present invention, the circuitry of FIG. 2 is implemented in a CMOS device. That is, the circuitry needed to implement the differential amplifier, charge pump circuit and filtering circuit are all implemented in CMOS circuitry. According to one embodiment of the present invention, all the components of envelope generator 30 are formed on a single chip.

Figure 7:
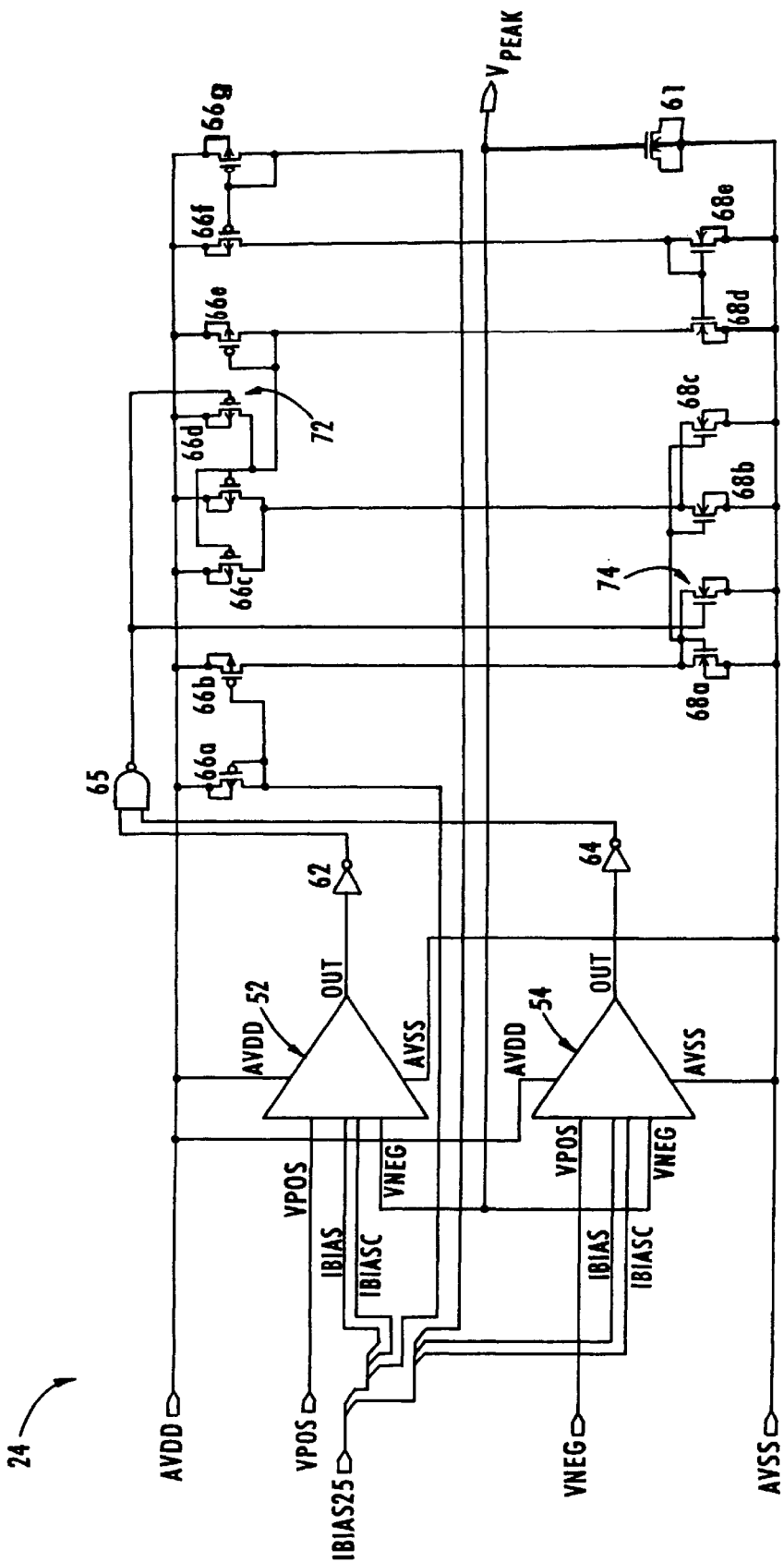
FIG. 7 is a schematic diagram of the charge pump circuit of FIG. 4 according to an embodiment of the present invention.

FIG. 7 is a detailed schematic diagram illustrating an exemplary charge pump circuit such as that depicted in FIG. 4 implemented in CMOS. Comparators 52 and 54 receive differential input signal VPOS,VNEG from differential amplifier 22 (shown in FIG. 2), and biasing current IBIAS. In the exemplary embodiment, the biasing current is about 25 $\mu$ amps.

As discussed earlier in connection with FIG. 4, when both VPOS and VNEG are lower than the output (Vpeak) of the charge pump circuit 24, comparators 52 and 54 will both output logical "0". The outputs of comparators 52 and 54 are fed through inverters 62 and 64, respectively, and then to NAND gate 65. When both outputs of comparators 52 and 54 are "0", NAND gate 65 outputs logical "0" to the gate of transistor 72. Transistor 72 functions as a switch, corresponding to switch 56 in FIG. 4, and along with transistors 66a–g, operates to charge capacitor 61.

When both positive and negative inputs, VPOS and VNEG, are higher than the output Vpeak of charge pump circuit 24, the output of comparators 52 and 54 will be "1". NAND gate 65 then outputs "1" to the gate of transistor 74, Transistor 74 functions as a switch, corresponding to switch 59 in FIG. 4, and along with transistor 68a–e, operates to discharge capacitor 61. In this manner, the exemplary charge pump circuit 24 outputs Vpeak that follows the envelope of the input waveform.

Figure 8:
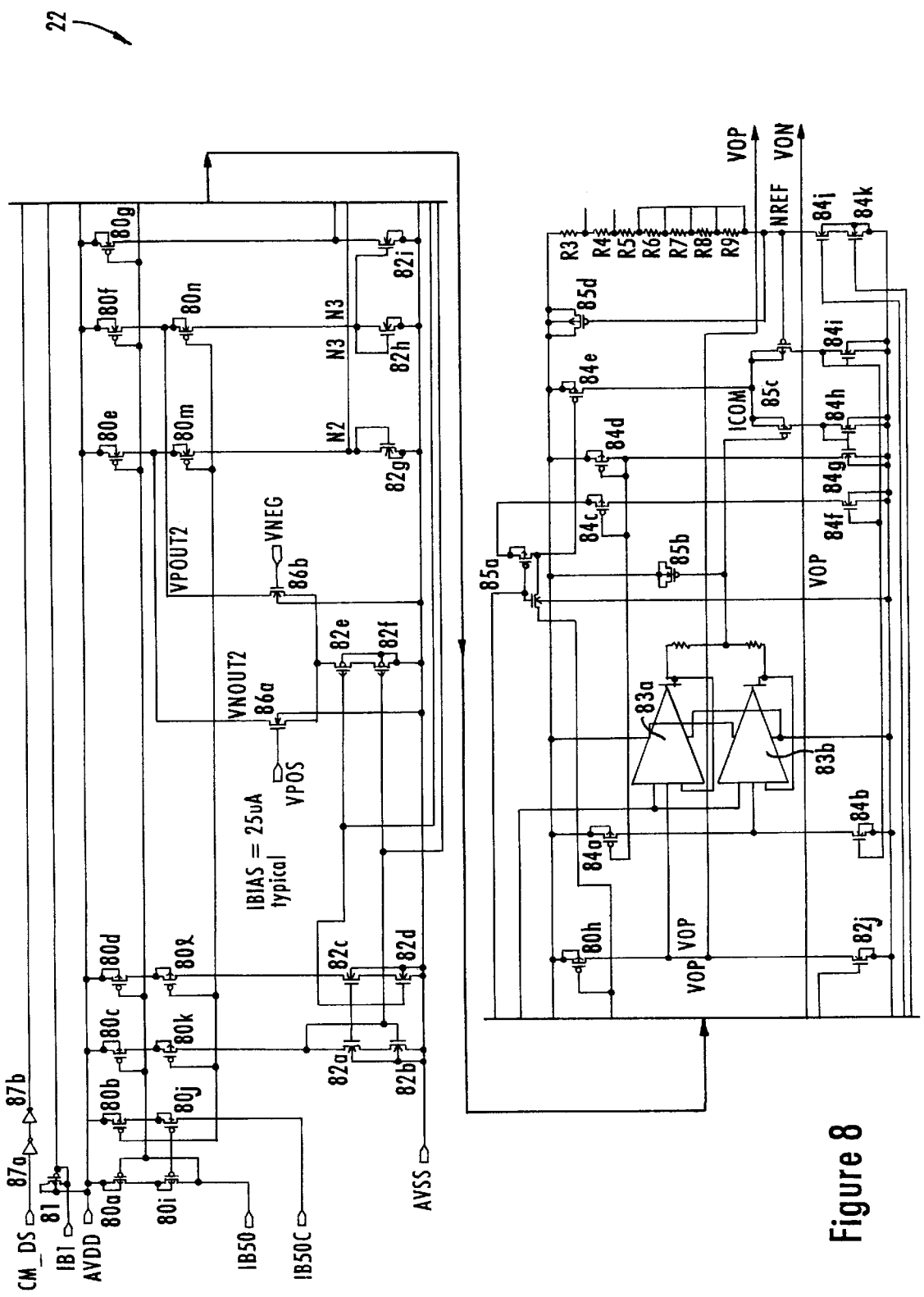
FIG. 8 is a schematic diagram of a differential amplifier according to an embodiment of the present invention.

FIG. 8 is an exemplary differential amplifier 22 in accordance with an embodiment of the present invention. Referring to FIG. 8, biasing currents, IB, are provided to transistors 80–85, typically 50 μamps. VPOS and VNEG correspond to VP and VN in FIG. 2 and are input to transistors 86a and 86b, typically biased at about 25 μ amps.

The exemplary differential amplifier 22 is a common mode feedback type amplifier and includes buffer amplifiers 83a and 83b. The values of resistors R1–R9 are based on the particular design requirements, e.g., the desired amplification level. The differential amplifier 22 amplifies the input signal, (VPOS–VNEG), approximately 0–40 dB, based on the particular design requirements, and outputs signal VOP, VON. Given the guidance and objectives disclosed herein, the specific values of the discrete elements, e.g., resistors, can be easily optimized based on the specific design requirements.

FIGS. 7 and 8 illustrate specific CMOS circuitry that can be used to generate the envelope of the incoming signal. However, other CMOS charge pump and differential amplifier configurations can also be used based on the specific design requirements.

Described has been an apparatus and method for generating an envelope waveform for data signals. An advantage of the invention is that the envelope generator is implemented in CMOS, thereby enabling high speed operation with low power consumption. Another advantage of the invention is that the CMOS device provides high reliability at a low cost.

In this disclosure, there is shown and described only the preferred embodiments of the invention, but, as aforementioned, it is to be understood that the invention is capable of use in various other combinations and environments and is capable of changes or modifications within the scope of the inventive concept as expressed herein.

What is claimed is:

1. A CMOS device configured for receiving data transmitted over a twisted pair medium, comprising:
    a receive device configured to receive an analog signal transmitted over the twisted pair medium; and
    an envelope generator configured to generate an envelope waveform based on the received analog signal, wherein the envelope generator comprises:
        a differential amplifier configured to receive the analog signal and generate an amplified differential signal therefrom; and
        a charge pump circuit coupled to the differential amplifier and configured to receive the amplified differential signal and generate a peak signal waveform therefrom.

2. The CMOS device of claim 1, comprising wherein the envelope generator further comprises:
    a filter circuit having an input coupled to the charge pump circuit and configured to filter the peak signal waveform and generate the envelope waveform.

3. The CMOS device of claim 2, wherein the filter circuit comprises:
    an operational amplifier having an input coupled to the charge pump circuit and configured to receive the peak signal waveform; and
    an RC circuit coupled to the operational amplifier configured to filter out noise and harmonic components from the peak signal waveform and generate the envelope waveform.

4. The CMOS device of claim 1, wherein the charge pump circuit comprises:
    first and second comparators configured to compare the amplified differential signal to the peak signal waveform output from the charge pump circuit; and
    control logic configured to charge and discharge a capacitor based on the output from the first and second comparators.

5. The CMOS device of claim 1, wherein the analog signal represents data from a group of pulsed data signals.

6. The CMOS device of claim 1, wherein the envelope generator is formed on a single chip.

7. The CMOS device of claim 1, wherein the twisted pair medium comprises telephone line wiring.

8. In a network station that includes a CMOS device for receiving and transmitting data over a twisted pair medium, a method of generating a waveform envelope, comprising:
    receiving an analog signal transmitted over the twisted pair medium; and generating an envelope waveform for the received analog signal, wherein the generating step comprises:
        amplifying the received analog signal; and
        inputting the amplified signal to a charge pump circuit, and
        generating in the charge pump circuit, a peak signal waveform.

9. The method of claim 8, further comprising wherein the generating step further comprises:
    filtering the peak signal waveform to generate the envelope waveform.

10. The method of claim 9, wherein the filtering step comprises:
    inputting the peak signal waveform to an operational amplifier coupled to an RC filter circuit; and
    outputting the envelope waveform.

11. The method of claim 8, wherein the analog signal represents data from a group of pulsed data signals.

12. The method of claim 8, wherein generating the envelope waveform is performed on a single chip.

13. The method of claim 8, wherein the twisted pair medium comprises telephone line wiring.

14. A CMOS device, provided in a network station connected to a network employing a telephone line medium to connect network stations, comprising:
    a receive device configured to receive an analog signal transmitted over the telephone line, wherein the analog signal represents a group of data signals sent from another network station; and
    an envelope generator configured to generate an envelope waveform based on the received analog signal, wherein the envelope generator comprises:
        a differential amplifier configured to receive the analog signal and generate an amplified differential signal; and
        a charge pump circuit coupled to the differential amplifier and configured to receive the amplified differential signal and generate a peak signal waveform.

15. The CMOS device of claim 14, wherein the envelope generator further comprises:

a filter circuit having an input coupled to the charge pump circuit and configured to filter the peak signal waveform and generate the envelope waveform.

16. The CMOS network device of claim 15, wherein the charge pump circuit comprises:

first and second comparators configured to compare the amplified differential signal to the peak signal waveform output from the charge pump circuit; and control logic configured to charge and discharge a capacitor based on the output from the first and second comparators.

* * * * *